US007275945B1

(12) United States Patent
Yi et al.

(10) Patent No.: US 7,275,945 B1
(45) Date of Patent: Oct. 2, 2007

(54) CHASSIS WITH MULTI-CANTILEVER SPRING FINGERS FOR EMI SHIELDING AND ESD PROTECTION OF ELECTRONIC DEVICES

(75) Inventors: George Youzhi Yi, Fremont, CA (US); Kuang Hsin Hsu, Taipei (TW); Hung-Ting Lin, Taipei (TW)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 11/252,116

(22) Filed: Oct. 17, 2005

(51) Int. Cl.
*H01R 13/53* (2006.01)

(52) U.S. Cl. ...................................................... 439/181

(58) Field of Classification Search ................ 439/181, 439/101, 108, 92, 607, 609, 669, 857; 361/818; 174/354, 352
See application file for complete search history.

(56) References Cited

U.S. PATENT DOCUMENTS

| | | | | |
|---|---|---|---|---|
| 5,267,882 A | * | 12/1993 | Davis | .......................... 439/680 |
| 5,348,484 A | * | 9/1994 | Sorrentino | ................... 439/101 |
| 5,735,712 A | * | 4/1998 | Haas et al. | .................. 439/609 |
| 5,934,940 A | * | 8/1999 | Maranto et al. | ............ 439/607 |
| 6,618,271 B1 | * | 9/2003 | Erickson et al. | ............ 361/818 |
| 2006/0092608 A1 | | 5/2006 | Liang et al. | ................. 361/695 |
| 2006/0139895 A1 | | 6/2006 | Justason et al. | ............. 361/753 |

\* cited by examiner

*Primary Examiner*—Alexander Gilman
(74) *Attorney, Agent, or Firm*—BainwoodHuang

(57) ABSTRACT

A chassis utilizes spring fingers having contact portions and mid portions where each spring finger forms multiple cantilevers to provide different spring constants. Accordingly, the increase in force resulting from displacement can be better controlled and even minimized for certain ranges of displacement. In particular, each spring finger can be configured to perform in an operating range characterized by a smaller spring constant. As a result, the force increase in this operating range is slower thus accommodating circuit boards with large connector height variations without significantly changing the normal contact force. Such operation enables the chassis to consistently pass EMI and ESD testing, as well as provide more reliable device operation.

20 Claims, 8 Drawing Sheets

CHASSIS WITH MULTI-CANTILEVER SPRING FINGERS FOR EMI SHIELDING AND ESD PROTECTION OF ELECTRONIC DEVICES

BACKGROUND

A metallic spring finger is a device which is capable of biasing an object or providing a holding force on the object in order to maintain the object at a fixed position relative to a main body. FIG. 1 shows a side view 20 of a metallic spring finger 22 attached to a main body 24. As shown, the metallic spring finger 22 includes (i) a V-shaped end portion 26, and (ii) a substantially flat middle portion 28 which connects the V-shaped end portion 26 to the main body 24. Here, the overall length (L) of the entire spring finger 22 from the main body 24 to the end of the spring finger 22 is based on the length contributions of both the middle portion 28 and the V-shaped end portion 26 (see FIG. 1).

Such a metallic spring finger 22 applies a reaction spring force (F) in response to a displacement (D), e.g., due to displacement by an object 29. The dashed lines show the metallic spring finger 22 in a new position after being displaced from its original position. In general, the spring force (F) provided by the metallic spring finger 22 is a function of a spring constant (k) and the displacement (D).

$$F = k * D \qquad (1).$$

Equation (1) illustrates the function for determining the spring force (F) provided by the metallic spring finger 22 in FIG. 1.

FIG. 2 is a graphical illustration as to how the spring force (F) of the above-described conventional metallic spring finger 22 increases linearly as the displacement (D) increases. The slope of the curve in FIG. 2 is equal to the spring constant (k).

It should be understood that due to the above-described property of the metallic spring finger 22, the metallic spring finger 22 is suitable for positioning or holding an object relative to the main body 24. For example, as shown by the solid lines in FIG. 1, the metallic spring finger 22 may initially extend from the main body 24 at a 90 degree angle. Then, when an object 29 is placed at a location 30 between the metallic spring finger 22 and the surface 32 upon which the main body 24 is mounted resulting in the metallic spring finger 22 being pushed in a direction away from the surface 32 to the new position which is slightly greater than 90 degrees (shown in phantom in FIG. 1), the metallic spring finger 22 responds by providing the force (F) against the object to hold the object at the location 30.

SUMMARY

Unfortunately, there are deficiencies to the above-described conventional metallic spring finger 22 in which the overall spring finger length (L) is based on contributions by both the middle portion 28 and the V-shaped end portion 26 as shown in FIG. 1. In particular, the conventional metallic spring finger 22 is not very well-suited for use in certain chassis designs for electronic devices. For example, in the context of a wireless or non-wireless router, the router manufacturer may contemplate using rows of metallic spring fingers 22 around the peripheries of port openings in order to provide electromagnetic interference (EMI) shielding and electrostatic discharge (ESD) protection. However, experimental testing has shown that the metallic spring fingers 22 cannot concurrently provide sufficient EMI shielding and secure contact for proper ESD protection (e.g., due to non-elastic material properties of the metallic spring fingers 22).

Additionally, the conventional geometry of the spring fingers 22 makes it difficult for the manufacturer to properly install circuit boards into metal frames equipped with the spring fingers 22. Specifically, the reaction spring force (F) provided by the spring fingers 22 in response to displacement of the spring fingers 22 (e.g., by objects 29) linearly increases based on the amount of deformation (D) (see Equation (1) and FIG. 2). To avoid installation failures, the spring fingers 22 have to be manually lifted to gain room for the objects 29 to enter, and lifting multiple spring fingers 22 simultaneously is extremely difficult. Moreover, in the case of large tolerance variations in height of objects (e.g., RJ connectors, USB ports, etc.), the spring fingers 22 must be significantly displaced in order to properly insert a circuit board so that certain circuit board connector ports pass through port openings surrounded by the spring fingers 22. If there is too much spring force (F), there is a high probability that the spring fingers 22 will scratch through nickel plating around the connector ports and thus damage the metallic layers around the connector ports which provide EMI shielding and ESD protection.

Furthermore, due to tolerance stack up issues and thus variations in the displacement (D) of each spring finger 22, the amount of spring force (F) provided by each spring finger 22 may vary widely. Such inconsistencies result in some connector ports loosing EMI shielding and ESD protection due to high impedance from the poorly contacting spring fingers 22. As a result, the routers may fail EMI and ESD testing as well as perform poorly once the circuit boards are installed and operational.

In contrast to the above-described conventional spring finger 22 in which the spring finger overall length (L) is based on contributions by both the middle portion 28 and the V-shaped end portion 26 (FIG. 1), embodiments of the invention are directed to chassis which utilize spring fingers having contact portions and mid portions where each spring finger forms multiple cantilevers to provide different spring constants. Accordingly, the force increase resulting from displacement can be better controlled and even minimized for certain ranges of displacement. In particular, each spring finger can be configured to perform in an operating range characterized by a smaller spring constant. As a result, the force increase in this operating range is slower thus accommodating circuit boards with large connector height variations and different connector types without significantly changing the normal contact force. Such operation enables the chassis to consistently pass EMI and ESD testing, as well as provide more reliable device operation.

One embodiment is directed to a chassis for a circuit board module having a circuit board and connectors mounted along an edge of the circuit board. The chassis includes a base configured to reside in an installed position relative to the circuit board, and a frame portion coupled to the base. The frame portion defines connector openings corresponding to the connectors of the circuit board. The chassis further includes spring fingers coupled to the frame portion. The spring fingers are configured to provide electrical pathways from the connectors of the circuit board to the frame portion when the base resides in the installed position relative to the circuit board. Each spring finger has a contact portion configured to contact one of the connectors, and a mid portion which interconnects that contact portion with the frame. Each spring finger forms (i) a first cantilever at a first location where the mid portion of that spring finger attaches to the frame portion and (ii) a second cantilever at a second location where the contact portion of that spring finger attaches to the mid portion of that spring finger. A distance between the first and second locations defines an overall length of that spring finger.

BRIEF DESCRIPTION OF THE DRAWINGS

The foregoing and other objects, features and advantages of the invention will be apparent from the following description of particular embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

Embodiments of the invention are directed to chassis which utilize spring fingers having contact portions and mid portions where each spring finger forms multiple cantilevers to provide different spring constants. Accordingly, the force increase resulting from displacement can be better controlled and even minimized for certain ranges of displacement. In particular, each spring finger can be configured to perform in an operating range characterized by a smaller spring constant. As a result, the force increase in this operating range is slower thus accommodating circuit boards with large connector height variations and different connector designs without significantly changing the normal contact force. Such operation enables the chassis to consistently pass EMI and ESD testing, as well as provide more reliable device operation.

Figure 3:
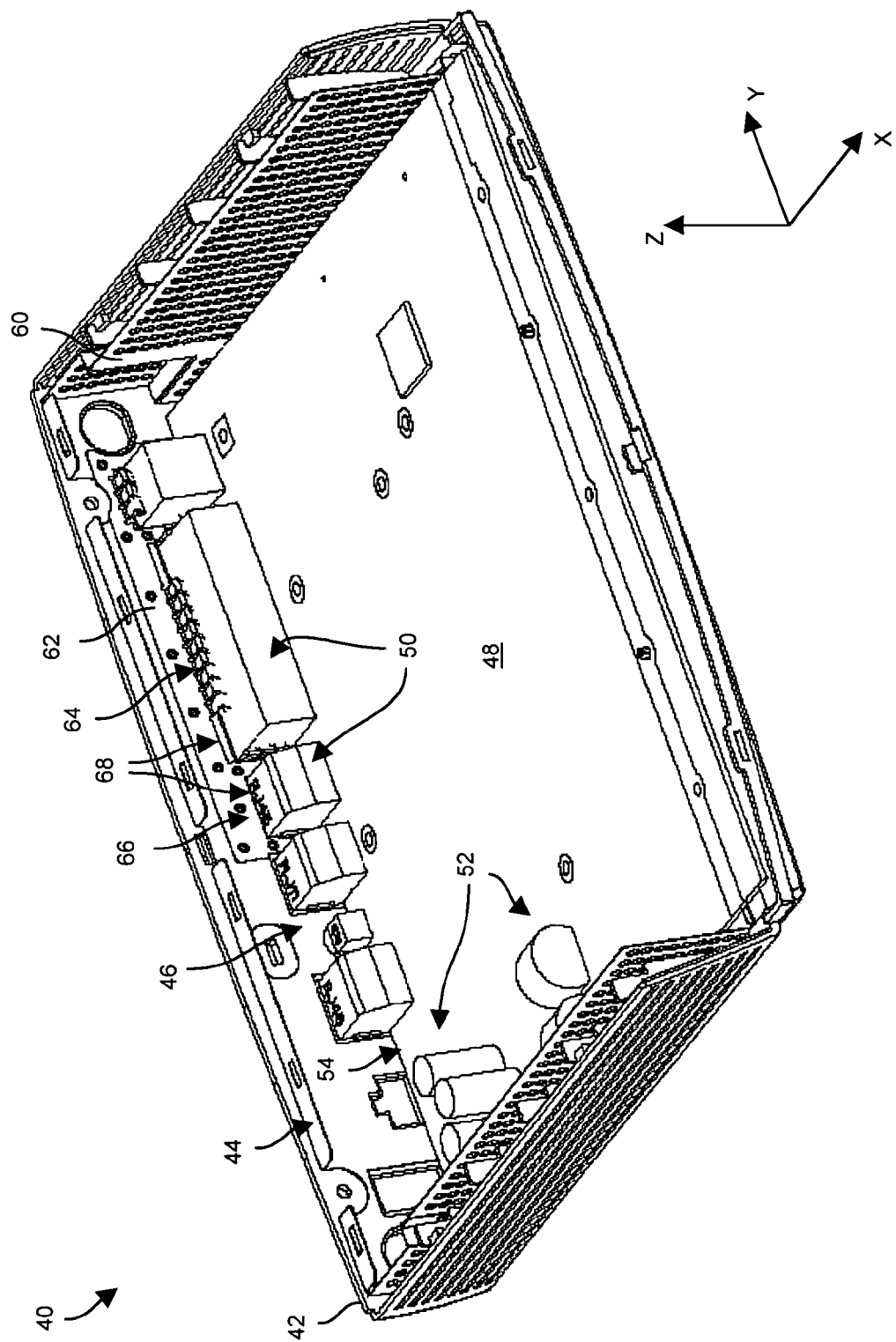
FIG. 3 is a perspective view of an electronic system which utilizes spring fingers having multiple cantilevers to provide different spring constants.

FIG. 3 shows an electronic system 40 which utilizes spring fingers that form multiple cantilevers to provide different spring constants. The electronic system 40 includes a housing 42, a metallic chassis 44 (e.g., tin, copper, nickel plated surfaces, sheet metal, etc.) which installs within the housing 42, and a circuit board module 46 which installs within the metallic chassis 44. It should be understood that the electronic system 40 includes other components (e.g., a top cover, a fan assembly, a power supply, etc.) which are omitted from FIG. 3 to better illustrate spring finger details of the electronic system 40.

The circuit board module 46 includes a circuit board 48, I/O connectors 50, and a variety of other circuit board components 52 (e.g., integrated circuit devices, heat sinks, discrete components, etc.) which are shown generally by the arrow 52 in FIG. 3. The circuit board 48 is substantially planar in shape and extends in the X-Y plane. The connectors 50 mount to the circuit board 48 in a row along a circuit board edge 54 and pass through portions of both the chassis 44 and the housing 42 for external accessibility.

In some arrangements, the electronic system 40 is a network device (e.g., wireless router which is capable of performing both wireless and non-wireless data communications operations). Along these lines and by way of example, the I/O connectors 50 include a variety of different connector designs (e.g., RJ11, RJ45, a four-port RJ45 assembly, a USB port, etc.) thus enabling the electronic system 40 to communicate through a variety of different cables and connectors. Other connector designs are suitable for use as well (DSUB, Firewire, and so on).

As further shown in FIG. 3, the metallic chassis 44 includes a base 60, a frame portion 62, multi-cantilevered spring fingers 64, and tab members 66 (shown generally by the arrow 66 in FIG. 3) which are integrated together to form a metallic unitary body. The base 60 attaches to the housing 42 and forms a portion of an EMI barrier around the circuit board 48. The frame portion 62 couples to the base 60, and defines connector openings 68 which correspond to the connectors 50 of the circuit board module 46. The multi-cantilevered spring fingers 64 and the tab members 66 fasten to the frame portion 62 around the connector openings 68. As a result, the multi-cantilevered spring fingers 64 and the tab members 66 form EMI seals around the connectors 50, and further provide electrical pathways from the connectors 50 to the frame portion 62 and the base 60.

At this point, it should be understood that the use of the multi-cantilevered spring fingers 64 facilitates installation of the circuit board module 46 during assembly of the electronic system 40. Such use further enables the chassis 44 to accommodate large tolerance variations in the connectors 50 (e.g., connector height) but still provide constant and reliable contact force to the connectors 50 for reliable and consistent EMI shielding and ESD protection. Such a design guarantees competent long term electrical conductivity. Further details will now be provided with reference to FIGS. 4 through 6.

Figure 4:
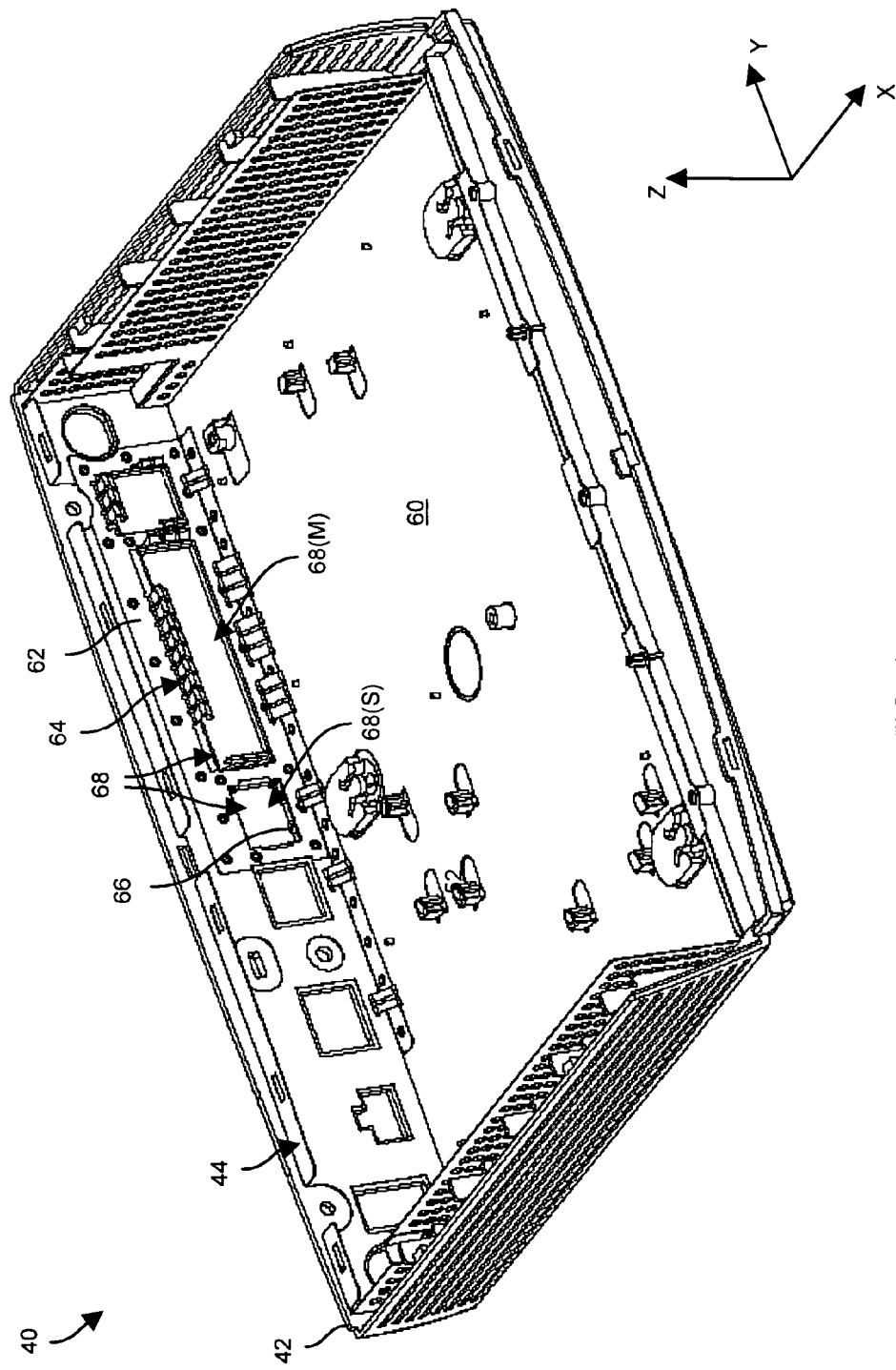
FIG. 4 is a perspective view of a portion of the electronic system of FIG. 3 prior to installation of a circuit board module.
Figure 5:
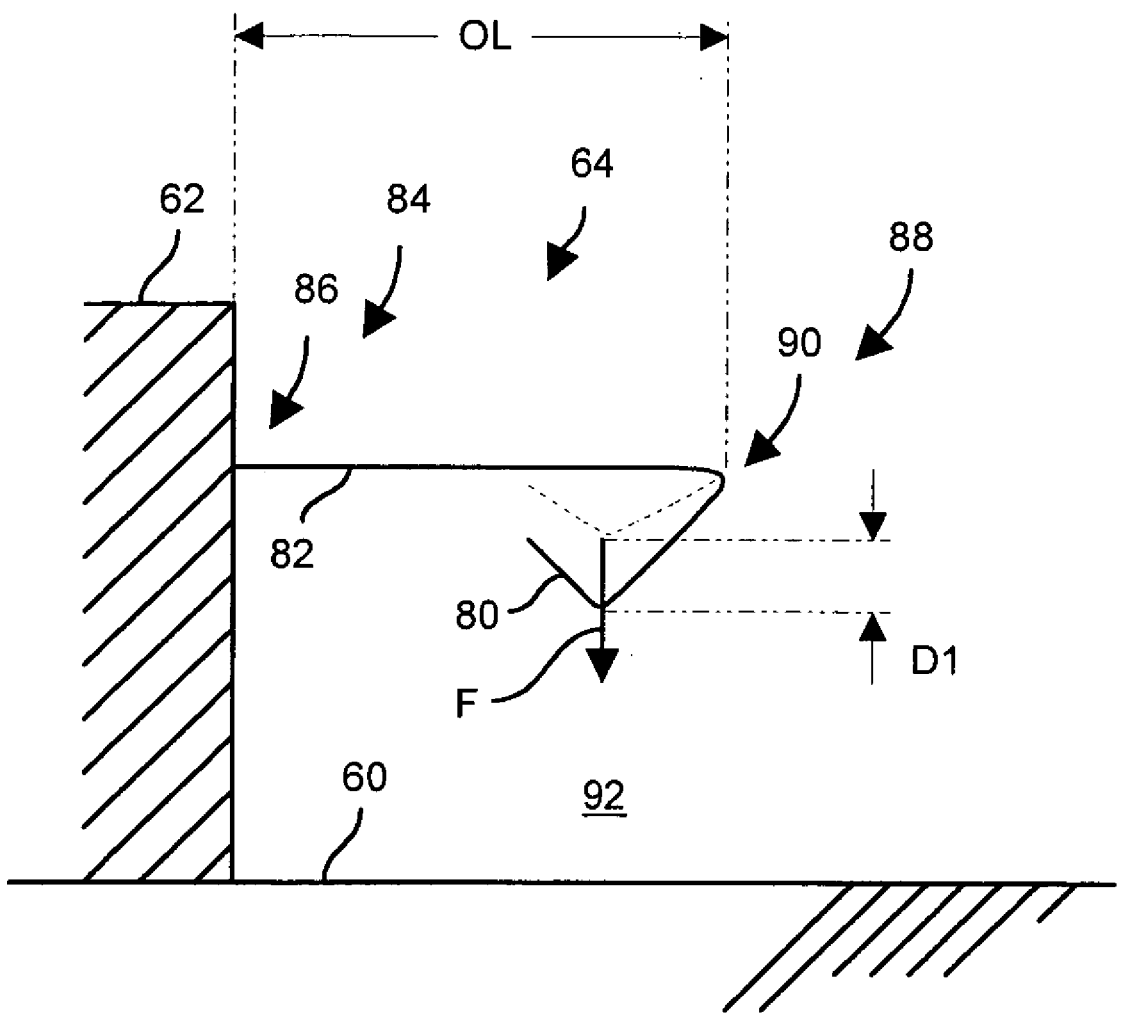
FIG. 5 is a side view of a spring finger of the electronic system of FIG. 3 when undergoing a displacement.

FIG. 4 is a perspective view of a portion of the housing 42 and the chassis 44 of the electronic system 40 prior to installation of the circuit board module 46. FIG. 5 is a side view of a multi-cantilevered spring finger 64 when undergoing a small displacement (D1). FIG. 5 is a side view of a multi-cantilevered spring finger 64 when undergoing a further displacement (D2) resulting in an overall displacement (DT).

As shown in FIG. 4, the frame portion 62 of the chassis 44 defines a single-port connector opening 68(S) and a multi-port connector opening 68(M). Both openings 68(S), 68(M) are rectangular in shape to mirror the shapes of their corresponding connectors 50 (FIG. 3). The single port connector opening 68(S) is skirted with multi-cantilevered spring fingers 64 on three sides, i.e., with two spring fingers 64 on each lateral side and three spring fingers 64 on a top side. Similarly, the multi-port connector opening 68(M) is skirted with spring fingers 64 on three sides, i.e., with a series of three spring fingers 64 on each lateral side and a series of nine spring fingers 64 on a top side. The spring fingers 64 and tab members 68 are capable of being used around other openings 68 as well.

As shown in FIG. 5, each multi-cantilevered spring finger 64 includes a contact portion 80, and a mid portion 82 which interconnects that contact portion 80 with the frame portion 62. The spring finger 64 forms a first cantilever 84 at a first location 86 where the mid portion 82 attaches to the frame portion 62. The cantilever 84 is substantially at 90 degrees to properly frame a connector 50 (also see FIG. 3). Furthermore, the spring finger 64 forms a second cantilever 88 at a second location 90 where the contact portion 80 attaches to the mid portion 82. The cantilever 88 is substantially less than 90 degrees to enable the contact portion 80 of the spring finger 64 to extend back over the connector 50 and to provide a point of contact between the spring finger 64 and the connector 50 which is relatively central to the body of the connector 50 (FIG. 3). A measured distance between the first and second locations defines an overall length (OL) of the spring finger 64.

At this point, it should be understood that the multi-cantilevered spring finger 64 is capable of actuating at two points, i.e., the location 86 and the location 90. It should be further understood that the spring constant (k1) at the location 86 and the spring constant (k2) at the location 90 are different thus enabling the cantilevers 84, 88 to compress at different times in response to a large displacement. In particular, the spring constant (k1) is larger than the spring constant (k2). Accordingly, the cantilever 84 returns more force upon compression than the cantilever 88. This feature enables the cantilever 88 to operate first in response to a small displacement (D1). FIG. 5 shows the spring finger 64 with no displacement using solid lines, and the spring finger 64 with the small displacement (D1) in dashed lines.

Figure 6:
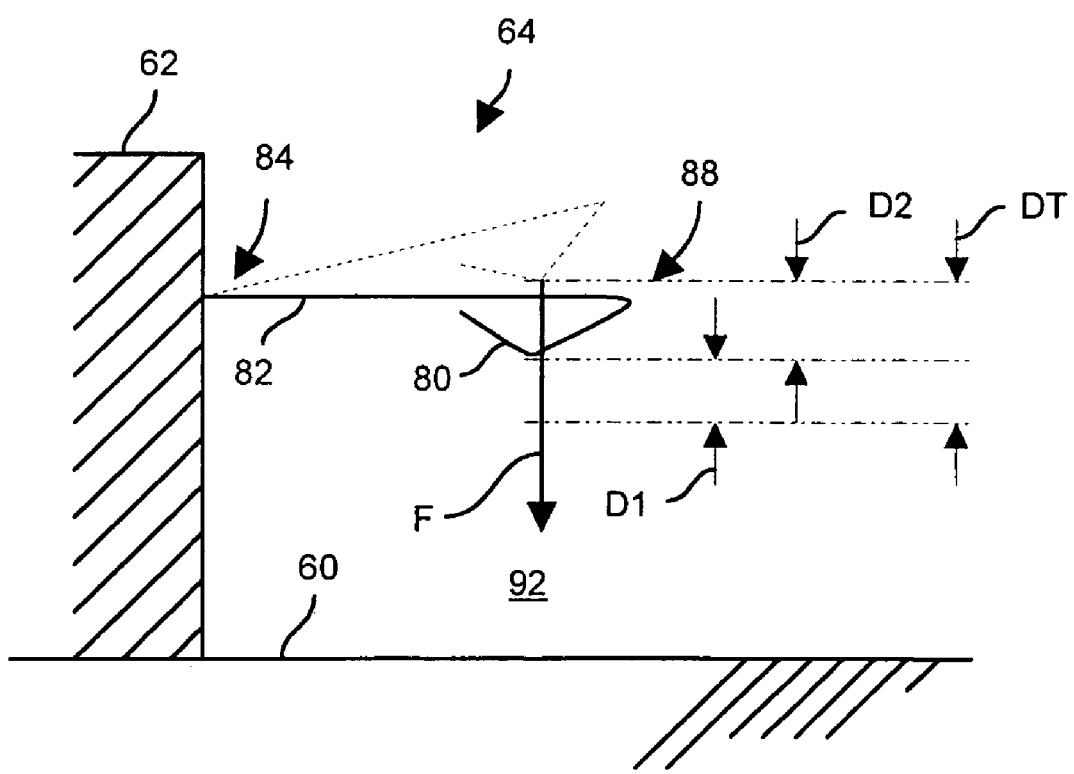
FIG. 6 is a side view of the spring finger of FIG. 5 when undergoing a further displacement.

Once the cantilever 88 of the spring finger 64 has been displaced to its maximum extent, the cantilever 84 with the greater spring constant (k1) operates to accommodate further displacement (D2). That is, if the total displacement (DT) is beyond the small displacement (D1), the spring finger 64 is still capable of complying due to subsequent operation of the cantilever 84. FIG. 6 shows the spring finger 64 with the small displacement (D1) using solid lines (also shown in FIG. 5 in dashed lines), and the spring finger 64 with total large displacement (DT) in dashed lines. The total displacement (DT) equals the small displacement (D1) and the further displacement (D2).

Figure 1:
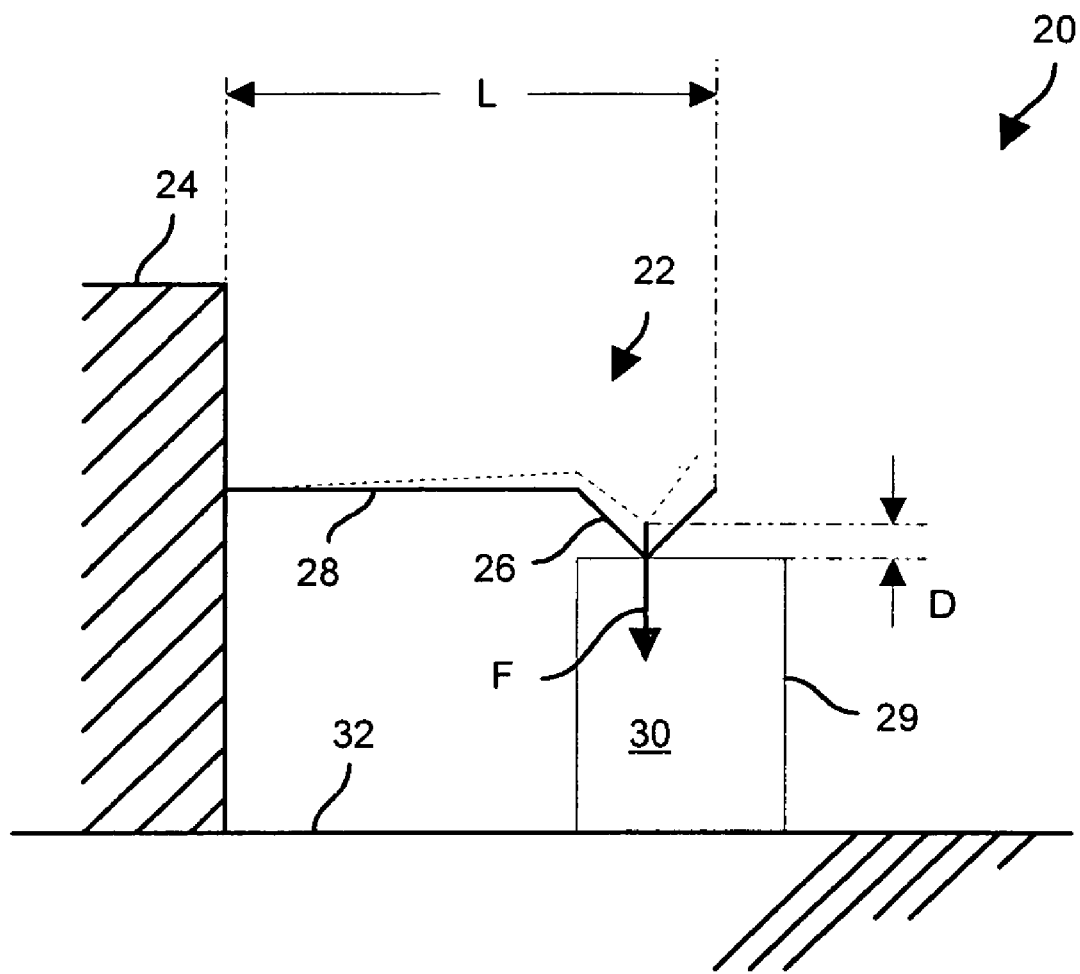
FIG. 1 is a side view of a conventional spring finger installed within in an operating environment.
Figure 2:
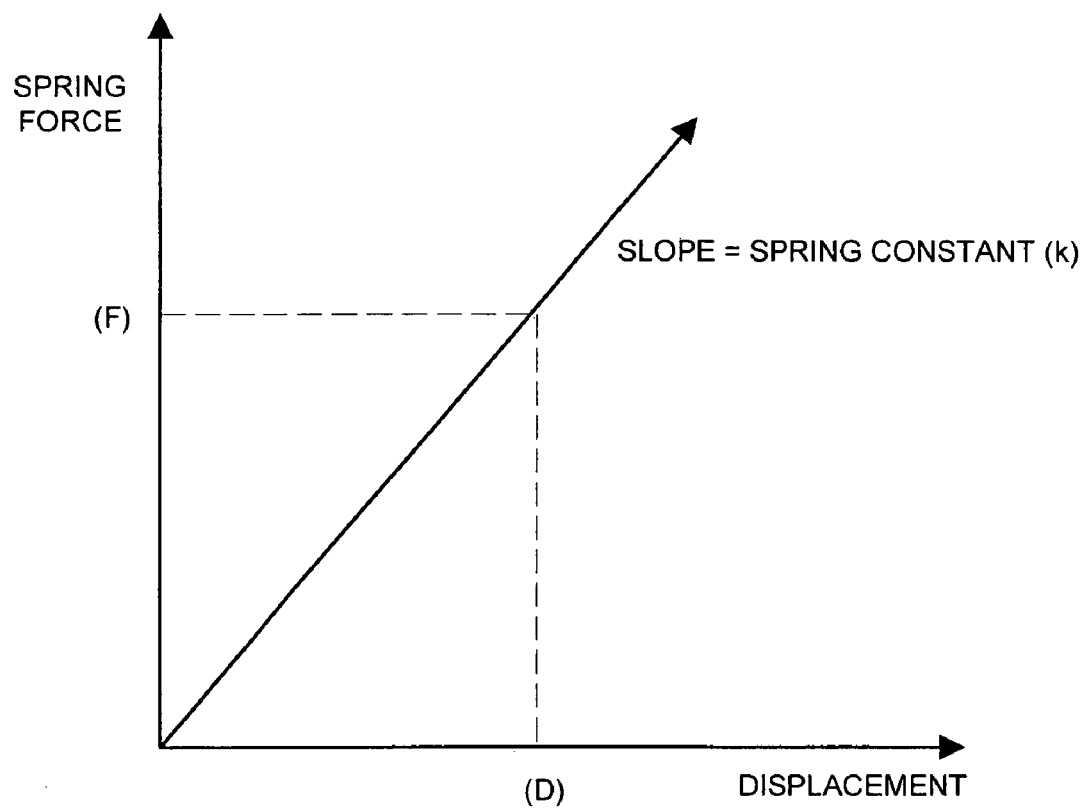
FIG. 2 is a curve illustrating how the spring finger provides spring force in response to displacement.
Figure 7:
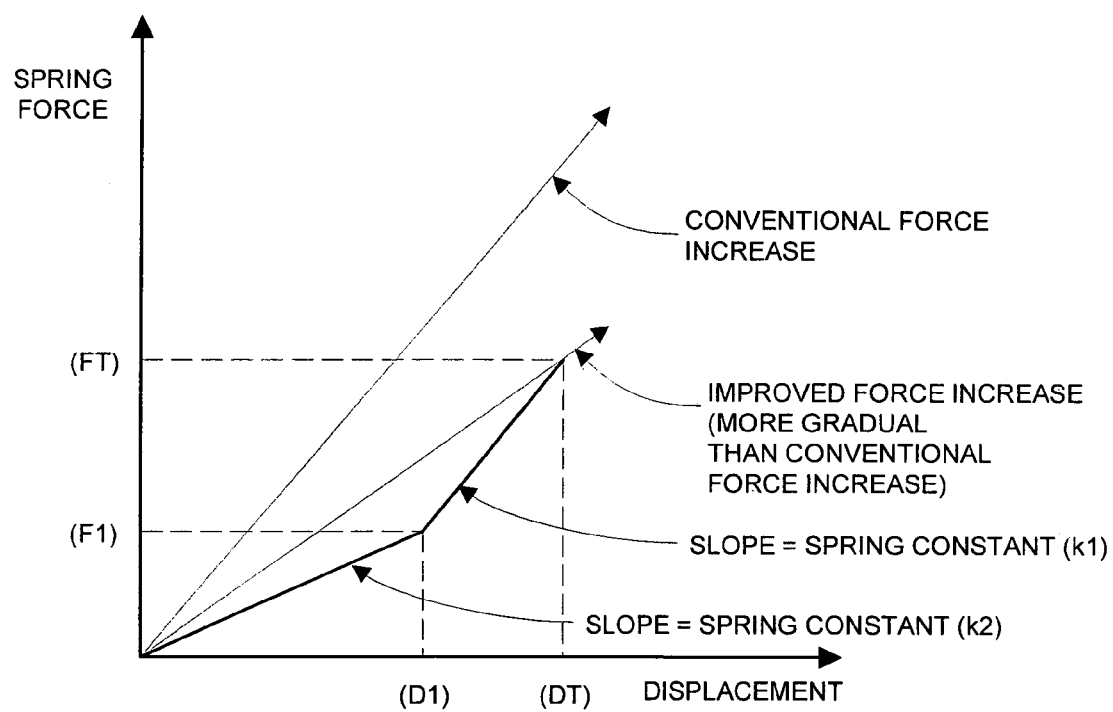
FIG. 7 is a curve illustrating how the spring finger of FIGS. 5 and 6 provides spring force in response to displacement.

FIG. 7 is a graphical illustration as to how the spring force (F) of the multi-cantilevered spring finger 64 increases as the displacement (D) increases. There are two slopes to the curve in FIG. 7 which correspond to the two deformation regions of FIGS. 5 and 6. In particular, due to displacement of the spring finger 64 in the range of no displacement to D1, the spring force (F) increases proportionately to the displacement by the spring constant (k2). This response is due to compression of the spring finger 64 predominantly at the cantilever 88 (also see FIG. 5) with the spring force (F) of the cantilever 88 being characterized by the spring constant (k2) which is purposefully configured to be smaller than the spring constant (k1) and the spring constant (k) for the earlier-described conventional spring finger 22 (FIGS. 1 and 2).

As further shown in FIG. 7, once the displacement of the spring finger 64 goes beyond (D1) and enters the range between (D1) and (D2), the spring force (F) continues to increase proportionately by the spring constant (k1). This change in response is due to compression of the spring finger 64 at the cantilever 84 (also see FIG. 6) with the spring force (F) of the cantilever 84 being characterized by the spring constant (k1). Here, the spring force (F) increases faster due to the cantilever 84 having a higher spring constant than that of the cantilever 88, i.e., the spring constant (k1) was purposefully configured to be higher than the spring constant (k2).

At this point, it should be understood that installation of the circuit board module 46 within the chassis 44 may require a relatively large displacement in the range between (D1) and (D2). As illustrated in FIG. 7, the overall spring force (FT) is nevertheless lower than the spring force of the earlier-described conventional spring finger 22. Accordingly, there is less likelihood of causing damage to the spring fingers 64 (FIGS. 3 and 4) of the chassis 44 or to the connectors 50 during installation.

It should be further understood that following installation of the circuit board 46 within the chassis 44, the connectors 50 continue to displace the spring fingers 64 but less than (D1). At this point, a connector 50 (e.g., a single port connector, a multi-port connector, etc.) resides at a location 92 either between a spring finger 64 and the base 60 of the chassis 44, or between two spring fingers 64 which apply force toward each other. In either situation, the amount of spring force (F) provided by each spring finger 64 of the chassis 44 is more accurately controlled. In particular, there is not such a wide range of spring forces (F) provided by the spring fingers 64. Rather, the exact amount of spring force (F) provided by each spring finger 64 falls within a narrow band thus enabling the manufacturer to enjoy robust EMI shielding and ESD protection due to consistent spring forces (F) applied to the connectors 50.

Figure 8:
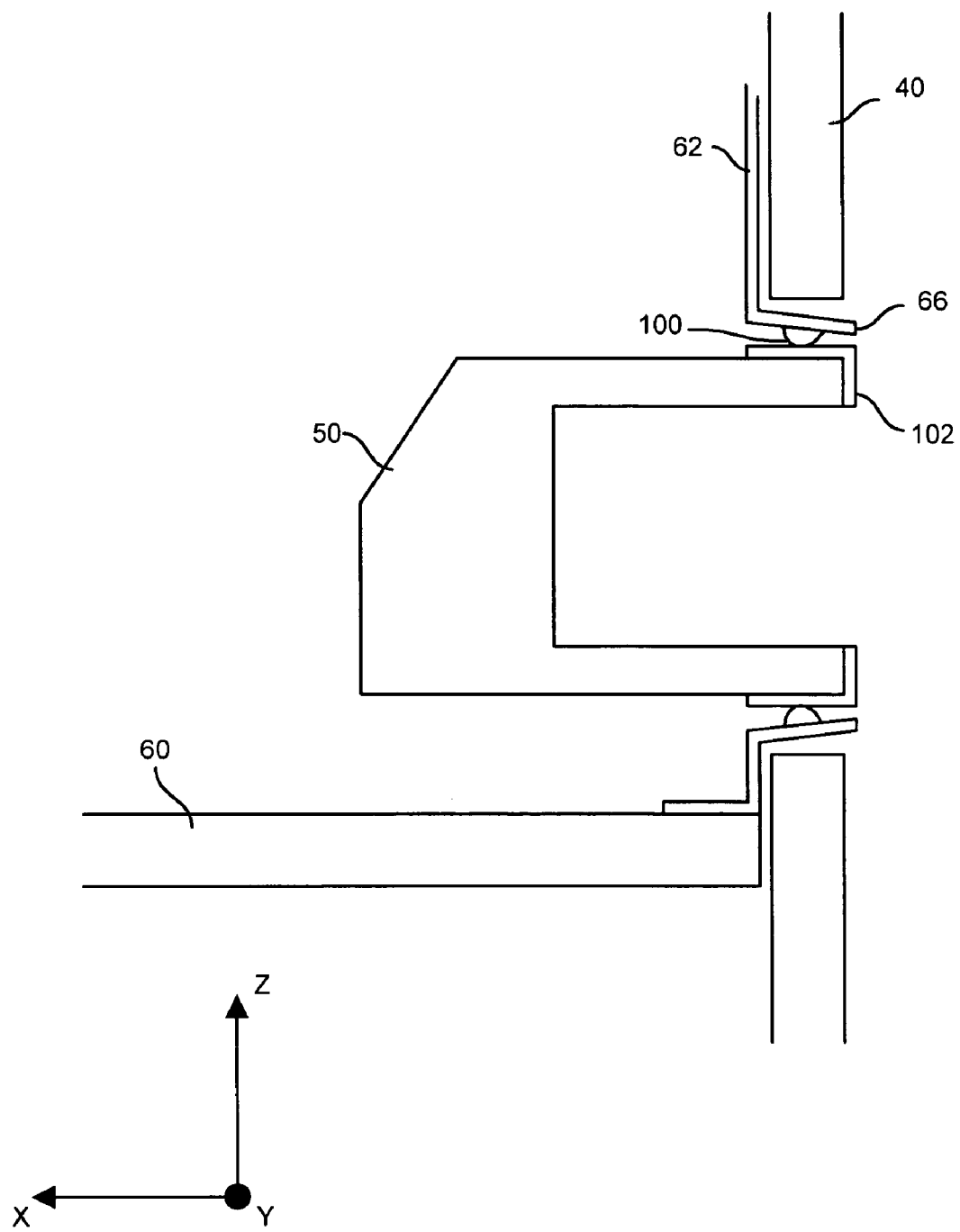
FIG. 8 is a side view of a tab member in contact with a partially shielded connector of the electronic system of FIG. 3.

Further details of the tab members 66 of the chassis 44 will now be provided with reference to FIGS. 4 and 8. FIG. 4 shows a perspective view of the tab members 66 which extend from the frame portion 62 of the chassis 44 in a direction (the negative X-direction away from the circuit board module 46 in FIG. 4) which is opposite the direction of the spring fingers 64 (the positive X-direction toward the circuit board module 46 in FIG. 4). Furthermore, FIG. 8 is a side view of a tab member 66 in contact with a partially shielded circuit board connector 50. The tab members 66 are configured to provide additional electrical pathways from the connectors 50 (also see FIG. 3) to the frame portion 62 when the circuit board module 46 resides in the chassis base 60.

As shown in FIG. 8, each tab member 66 defines a domed portion 100 which provides a precise point of contact between that tab member 66 and metallic shielding 102 of the corresponding connector 50 for a low impedance interface. Accordingly, the metallic shielding 102 is essentially extended to the chassis 44 thus providing enhanced EMI shielding and ESD protection to the corresponding connectors 50 (e.g., a partially shielded RJ11 connector with only limited area 102 being shielded by metal). In some arrangements, there are tab members 66 along each side of an opening 68. In other arrangements, there are tab members on less than each side, e.g., only on three sides to accommodate a circuit board, etc.

It should be understood that the above-described spring fingers 64 and tab members 66 are capable of being easily integrated with the other parts of the chassis 44 in order to form the chassis 44 s a cohesive unitary body. In some arrangements, the spring fingers 64 are provided onto the frame portion 62 using an extrusion riveting process (e.g., for providing zero Ohm impedance), and the tab members 66 are simply stamped, pressed and angled from a metal sheet into appropriate orientations relative to the frame portion 62. Such a manufacturing technique provides suitable mechanical strength and electrical properties for robust EMI and ESD characteristics.

As described above, embodiments of the invention are directed to a chassis 44 which utilizes a spring finger 64 having a contact portion 80 and a mid portion 82 where the spring finger 64 forms multiple cantilevers 84, 88 to provide different spring constants (k1), (k2). Accordingly, the rate of increase in force resulting from displacement can be better controlled and even minimized for certain ranges of displacement. In particular, the spring finger 64 can be configured to perform in an operating range characterized by a smaller spring constant (k1). As a result, the force increase in this operating range is slower thus accommodating a circuit board module 46 with potentially large connector height variations and different types of connectors without significantly changing the normal contact force. Such operation enables the chassis 44 to consistently pass EMI and ESD testing, as well as provide more reliable device operation.

While this invention has been particularly shown and described with references to preferred embodiments thereof, it will be understood by those skilled in the art that various changes in form and details may be made therein without departing from the spirit and scope of the invention as defined by the appended claims.

What is claimed is:

1. An electronic system, comprising:
   a circuit board module having a circuit board and connectors mounted along an edge of the circuit board;
   a housing; and
   a chassis configured to attach to the housing and to provide shielding to the circuit board, the chassis having:
      a base configured to reside in an installed position relative to the circuit board,
      a frame portion coupled to the base, the frame portion defining connector openings corresponding to the connectors of the circuit board, and
      spring fingers extended from the frame portion, the spring fingers being configured to provide electrical pathways from the connectors of the circuit board to the frame portion when the base resides in the installed position relative to the circuit board, each spring finger having a contact portion configured to contact one of the connectors, and a mid portion which interconnects that contact portion with the frame portion, each spring finger forming (i) a first cantilever at a first location where the mid portion of that spring finger attaches to the frame portion and (ii) a second cantilever at a second location where the contact portion of that spring finger attaches to the mid portion of that spring finger, a distance between the first and second locations defining an overall length of that spring finger;
   wherein the first cantilever formed by each spring finger provides a first spring constant; and
   wherein the second cantilever formed by each spring finger provides a second spring constant which is different than the first spring constant wherein, for each spring finger, the first cantilever and the second cantilever formed by that spring finger are both constructed and arranged to deflect in a single common direction in response to contact by a connecting body as the connecting body passes through a connector opening to connect with a respective connector of the circuit board.

2. An electronic system as in claim 1 wherein the first spring constant is smaller than the second spring constant.

3. An electronic system as in claim 2, further comprising:
   tab members coupled to the frame portion, the tab members being configured to provide additional electrical pathways from the connectors of the circuit board module to the frame portion when the circuit board module resides in the installed position relative to the base.

4. An electronic system as in claim 3 wherein the circuit board module is configured to operate as a network router which performs wireless and non-wireless data communications operations.

5. An electronic system as in claim 1 wherein the first spring constant and the second spring constant are sized to direct the first cantilever at the first location to provide greater return force than that provided by the second cantilever at the second location in response to a single actuation force to effectuate actuation of the second cantilever before actuation of the first cantilever in response to the single actuation force.

6. An electronic system, comprising:
   a circuit board module having a circuit board and connectors mounted along an edge of the circuit board;
   a housing; and
   a chassis configured to attach to the housing and to provide shielding to the circuit board, the chassis having:
      a frame portion defining connector openings corresponding to the connectors of the circuit board,
      means for fastening the frame portion to the housing, and
      spring fingers extended from the frame portion, the spring fingers being configured to provide electrical pathways from the connectors of the circuit board to the frame portion, when the means for fastening resides in an installed position relative to the circuit board, each spring finger having a contact portion configured to contact one of the connectors and a mid portion which interconnects that contact portion with the frame portion, each spring finger forming (i) a first cantilever at a first location where the mid portion of that spring finger attaches to the frame portion and (ii) a second cantilever at a second location where the contact portion of that spring finger attaches to the mid portion of that spring finger, a distance between the first and second locations defining an overall length of that spring finger;
   wherein the first cantilever formed by each spring finger provides a first spring constant; and
   wherein the second cantilever formed by each spring finger provides a second spring constant which is different than the first spring constant wherein, for each spring finger, the first cantilever and the second cantilever formed by that spring finger are both constructed and arranged to deflect in a single common direction in response to contact by a connecting body as the connecting body passes through a connector opening to connect with a respective connector of the circuit board.

7. An electronic system as in claim 6 wherein the first spring constant is smaller than the second spring constant.

8. An electronic system as in claim 6 wherein the first spring constant and the second spring constant are sized to direct the first cantilever at the first location to provide greater return force than that provided by the second cantilever at the second location in response to a single actuation force to effectuate actuation of the second cantilever before actuation of the first cantilever in response to the single actuation force.

9. A chassis for a circuit board module having a circuit board and connectors mounted along an edge of the circuit board, the chassis comprising:
a base configured to reside in an installed position relative to the circuit board;
a frame portion coupled to the base, the frame portion defining connector openings corresponding to the connectors of the circuit board; and
spring fingers extended from the frame portion, the spring fingers being configured to provide electrical pathways from the connectors of the circuit board to the frame portion when the base resides in the installed position relative to the circuit board, each spring finger having a contact portion configured to contact one of the connectors, and a mid portion which interconnects that contact portion with the frame portion, each spring finger forming (i) a first cantilever at a first location where the mid portion of that spring finger attaches to the frame portion and (ii) a second cantilever at a second location where the contact portion of that spring finger attaches to the mid portion of that spring finger, a distance between the first and second locations defining an overall length of that spring finger;
wherein the first cantilever formed by each spring finger provides a first spring constant; and
wherein the second cantilever formed by each spring finger provides a second spring constant which is different than the first spring constant wherein, for each spring finger, the first cantilever and the second cantilever formed by that spring finger are both constructed and arranged to deflect in a single common direction in response to contact by a connecting body as the connecting body passes through a connector opening to connect with a respective connector of the circuit board.

10. A chassis as in claim 9 wherein the first spring constant and the second spring constant are sized to direct the first cantilever at the first location to provide greater return force than that provided by the second cantilever at the second location in response to a single actuation force to effectuate actuation of the second cantilever before actuation of the first cantilever in response to the single actuation force.

11. A chassis as in claim 9 wherein the first spring constant is smaller than the second spring constant.

12. A chassis as in claim 11 wherein each first cantilever is formed by the joining of the mid portion of one of the spring fingers and the frame at an angle which is substantially 90 degrees.

13. A chassis as in claim 11 wherein each second cantilever is formed by the joining of the mid portion and the contact portion of one of the spring fingers at an angle which is substantially less than 90 degrees.

14. A chassis as in claim 11 wherein at least one of the connector openings defined by the frame portion is a rectangular opening to receive a multi-port connector; and wherein some of the spring fingers are disposed in series along at least one side of the rectangular opening.

15. A chassis as in claim 11 wherein at least one of the connector openings defined by the frame portion is a rectangular opening to receive a multi-port connector; and wherein some of the spring fingers are disposed on exact three sides of the rectangular opening.

16. A chassis as in claim 11, further comprising:
tab members coupled to the frame portion, the tab members being configured to provide additional electrical pathways from the connectors of the circuit board module to the frame portion when the circuit board module resides in the installed position relative to the base.

17. A chassis as in claim 16 wherein each tab member defines a domed portion.

18. A chassis as in claim 17 the domed portion defined by each tab member is configured to contact a corresponding connector of the circuit board module when the circuit board module resides in the installed position relative to the base.

19. A chassis as in claim 17 wherein each spring finger extends from the frame portion in a first direction; and wherein each tab member extends from the frame portion in a second direction which is substantially opposite the first direction.

20. A chassis as in claim 17 wherein the frame portion is substantially flat; wherein each spring finger extends from the frame portion towards the circuit board module when the circuit board module resides in the installed position relative to the base; and wherein each tab member extends from the frame portion away from the circuit board when the circuit board module resides in the installed position relative to the base.

* * * * *